United States Patent [19]

Thomas

[11] Patent Number: 5,249,732
[45] Date of Patent: Oct. 5, 1993

[54] METHOD OF BONDING SEMICONDUCTOR CHIPS TO A SUBSTRATE

[75] Inventor: Michael E. Thomas, Milpitas, Calif.

[73] Assignee: National Semiconductor Corp., Santa Clara, Calif.

[21] Appl. No.: 15,473

[22] Filed: Feb. 9, 1993

[51] Int. Cl.⁵ ...................... H01L 21/60; H01L 21/50
[52] U.S. Cl. .................. 228/179.1; 228/180.22; 228/253; 228/254; 427/123; 437/183
[58] Field of Search ............ 228/179, 180.2, 246, 228/253, 254, 4.5, 904; 427/123; 383.7; 437/183

[56] References Cited

U.S. PATENT DOCUMENTS 5,090,119 2/1992 Tsuda et al. ................. 228/179
5,124,277 6/1992 Tsumura ..................... 228/904
5,193,738 3/1993 Hayes ........................ 228/254

Primary Examiner—Samuel M. Heinrich
Attorney, Agent, or Firm—William H. Murray; Stephen R. Robinson

[57] ABSTRACT

In a method of bonding a pad on a semiconductor chip to a corresponding pad on a carrier, a wire ball is attached to the pad on the chip by bonding one end of a low melting temperature aluminum alloy bond wire to the chip pad. The wire is then broken off at the bond. A bead is formed on the chip pad by heating the ball to a temperature slightly above the melting point of the bond wire material for a predetermined period of time. The melted bead is then placed into contact with a corresponding pad on the carrier.

15 Claims, 4 Drawing Sheets

METHOD OF BONDING SEMICONDUCTOR CHIPS TO A SUBSTRATE

BACKGROUND OF THE INVENTION

This invention relates to fabrication of semiconductor devices and more particularly to methods of bonding semiconductor chips to multichip modules.

Multichip modules are presently being fabricated using wire bonding or "flip chip" techniques. In the wire bonding technique, one end of a wire is bonded by thermal compression to a pad on the chip. The other end of the wire is bonded by thermal compression to a pad on the frame of the multichip carrier. Since an integrated circuit chip typically has multiple pads to which electrical connections must be made, there will be multiple wires extending from the pads on each chip to the pads disposed around the periphery of the carrier frame. As a result, the number of electrical connections which can be made between the chip and the carrier is limited by the number of pads disposed around the periphery of the die. Also, because of the space required to implement this technique, it is difficult, if not impossible to butt chips together on the carrier.

The flip chip technique, although overcoming some of the problems mentioned above in connection with the wire bonding technique is a relatively expensive technique to perform. Since this technique presently utilizes a lead/tin solder for effecting the bonds between the chip and the carrier, it is necessary to put down a barrier material to prevent the lead and tin from reacting with the aluminum pads on the chip.

SUMMARY OF THE INVENTION

It is therefore an object of the present invention to provide a method for fabricating multichip modules which overcome the deficiencies of the prior art method.

It is another object of the present invention to provide a method for fabricating multichip modules that is inexpensive and provides reliable bonds between the chips and the carrier.

These and other objects of the present invention are achieved by using the method of the present invention which comprises the steps of providing a bond wire comprising a low melting temperature aluminum alloy material; providing a semiconductor chip with at least one aluminum bond pad; and, for each pad to be bonded, forming a wire ball attached to the pad only bonding one end of the bond wire to the pad; and breaking the wire off at the bond.

After the wire balls are formed on the pads, the die is placed onto a carrier and heated to slightly above the melting point of the bond wire material for a predetermined period of time in order to melt the wire balls and further interdiffuse the ball and pad metals. The balls are then melted and placed into contact with corresponding aluminum pads on the multichip carrier, forming mechanical and electrical link connections the pads on the carrier and the pads on the chip.

In another embodiment of the present invention, a ball of bonding material is dispensed from a heated capillary tube on to the aluminum pad on the semiconductor chip. Following a delay to allow the further interdiffusion of the ball and pad metals, the ball is melted and placed into contact with the corresponding aluminum pad on the multicnip carrier, forming a mechanical and electrical connection between the chip and carrier pads.

DETAILED DESCRIPTION OF THE INVENTION

Figure 1A:
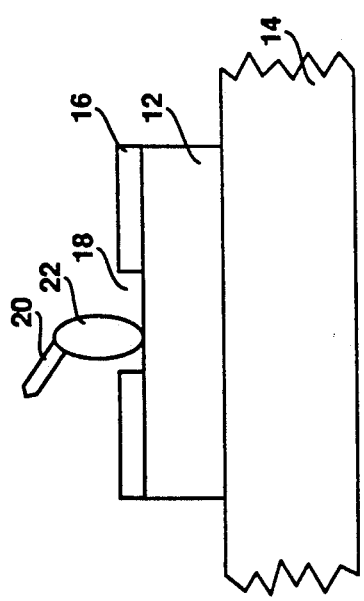
FIGS. 1A through 1D schematically depict steps of bonding semiconductor chips to a multichip carrier in accordance with a preferred embodiment of the present invention.

Referring now to FIGS. 1A through 1D, there is shown, in diagrammatic form, the steps of the method of bonding semiconductor chips to a multichip module in accordance with the present invention. In figure IA there is shown a representative aluminum bond pad 12 on a semiconductor chip 14. A protective layer 16 is formed over the surface of the chip 14 covering bond pad 12. In the preferred embodiment, the protective layer 16 comprises silicon nitride. A window 18 is formed in the layer 16 which exposes an upper surface of the bond pad 12.

A bond wire 20 is attached to the bond pad 12 through the window 18. It is preferred that the bond wire 20 comprises a low melting temperature aluminum alloy such as an aluminum-germanium alloy (melting point = 420° C.) or aluminum-magnesium alloys which have an A2 rich eutectic temperature of 451° C. or a magnesium rich eutectic temperature of 437° C. were melting occurs. For purposes of this detailed description, a low melting temperature aluminum alloy is defined as an aluminum alloy having a melting point of 500° C. or less. The bond wire 20 is bonded to the pad 12 preferably using standard thermal compression wire bonding techniques as are known in the art. When bonding, an irregularly shaped ball 22 is formed on the bond pad 12 at the end of the bond wire 20.

Figure 1B:
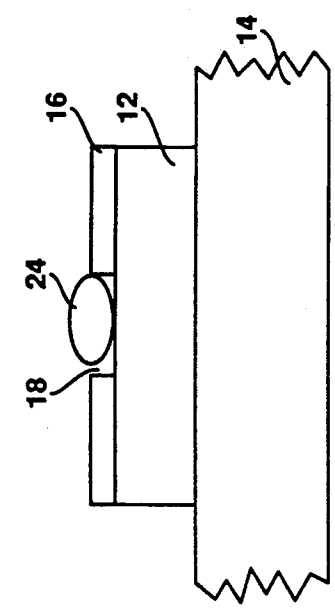

The bond wire 20 is then broken off in the region of the juncture of the wire 20 and the ball 22 in a temperature ambient which is maintained below the melting point of the bond wire material. The die is then placed onto a carrier having a temperature slightly above the melting point of the bond wire material, preferably at a temperature in a range of from approximately 430° C. to 450° C., for a predetermined time, preferably approximately 10 to 15 seconds, so that the ball 22 can melt and bond to the underlying aluminum pad 12, forming a bead 24, as depicted in FIG. 1B, by surface tension. This operation is preferably done under reducing or inert conditions to inhibit oxide formation on the aluminum alloys.

Figure 1C:
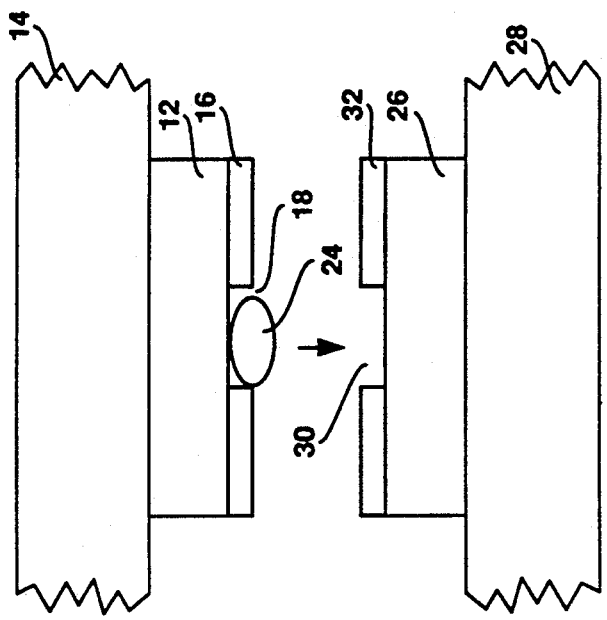
Figure 1D:
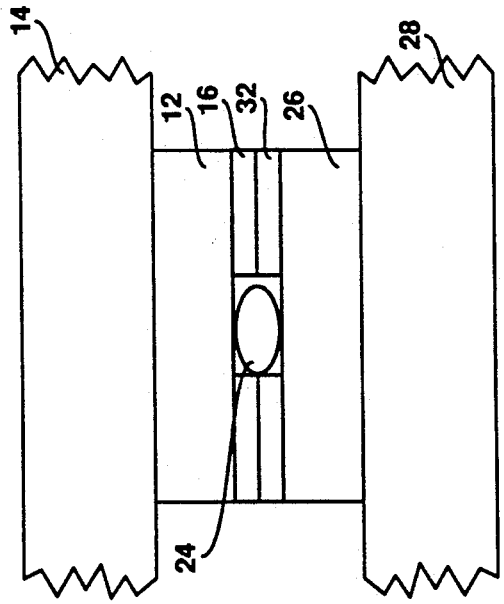

The structure, with the bead 24 disposed within the window 18, is heated, preferably to a temperature of approximately 450° C., and placed in contact with an aluminum pad 26 on a multichip carrier 28 through a window 30 in a protective layer 32 as shown in FIG. 1C. The protective layer 32 comprises a material, such as silicon nitride, which is an electrical insulator having sufficient strength to protect the surface of the carrier 28. Once in contact, as shown in FIG. 1D, the pad and ball materials interdiffuse and form a bond between the aluminum pad 12 of the semiconductor chip 14 and the aluminum pad 26 of the multichip carrier 28 as shown in FIG. 1D.

Figure 2A:
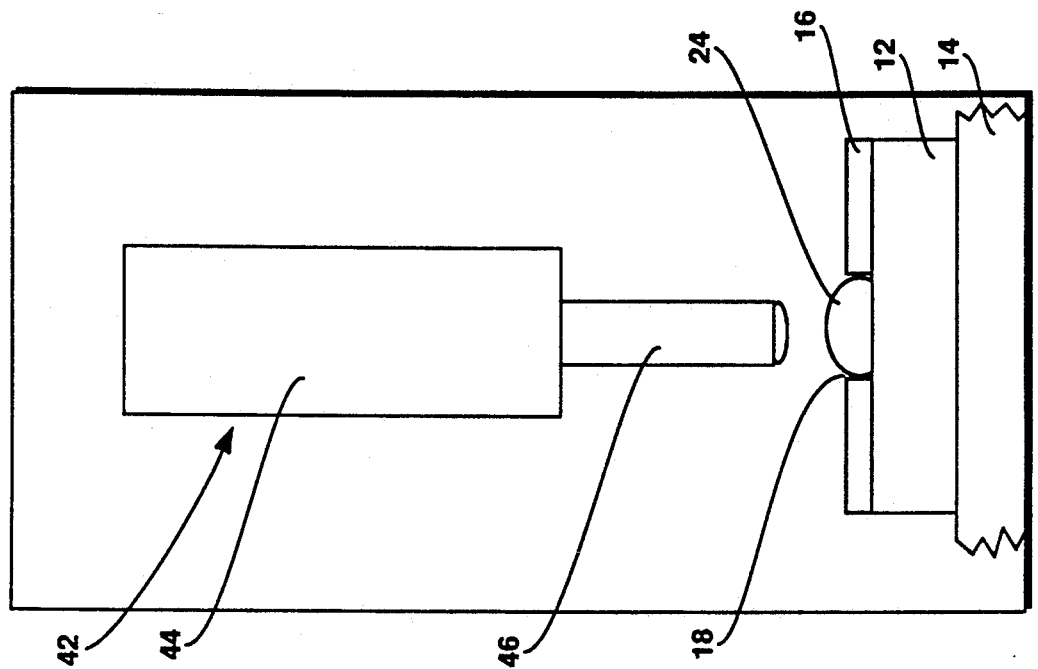
FIGS. 2A and 2B depict an alternate preferred embodiment of a method of forming bonding balls onto semiconductor chip bond pads in accordance with the present invention.
Figure 2B:
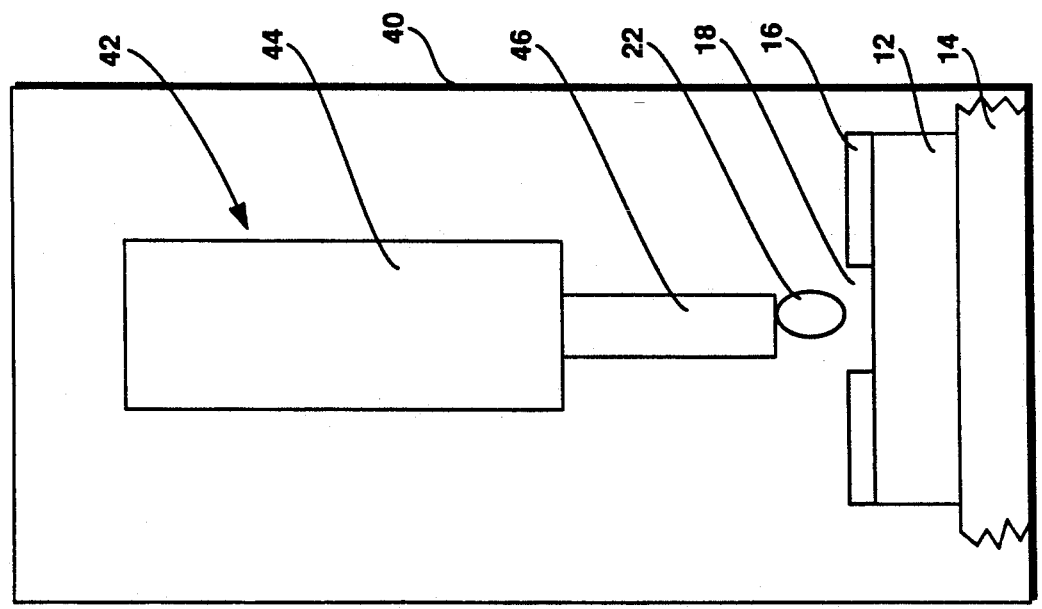

Now referring to FIGS. 2A and 2B, there is shown an alternate technique, in accordance with the present invention, for forming the bead 24 in contact with the aluminum pad 12 through the window 18 in the protective layer 16 formed over the aluminum pad 12. In this method, the semiconductor chip 14 is placed within an inert gas enclosure 40. A heated capillary 42, comprising a metal reservoir 44 and a capillary tube 46, is also located within the inert gas enclosure 40 with the end of the capillary tube 46 substantially aligned with the window 18 and the exposed upper surface of the aluminum pad 12. The bonding alloy material, preferable an aluminum-germanium alloy or an aluminum-magnesium alloy, is maintained in its liquid phase within the metal reservoir 44. The liquid alloy is dispensed from the end of the capillary tube 46 forming a bonding ball 22.

As shown in FIG. 2B, the bonding ball of the liquid aluminum alloy is deposited into the window 18 in the layer 16 onto the exposed surface of the aluminum pad 12 forming a bead 24. This operation is performed within the inert gas enclosure 40 in order to inhibit oxide formation on the aluminum alloy. The semiconductor chip is then removed from the inert gas enclosure 40 and the pads on the chip are bonded to corresponding pads on the multichip carrier 28 as previously discussed in connection with FIGS. 1C and 1D.

Although the above description of the method of the present invention discloses disposing the aluminum alloy balls into the windows 18 in the protective layer 16 over the aluminum pads 12 of the semiconductor chip 14; the aluminum alloy balls could also first be placed in the windows 30 in the protective layer 32 over the aluminum bonding pads 26 of the multichip carrier 28, which could then be bonded to corresponding aluminum bond pads on the semiconductor chips.

In addition, although the above description refers to the use of aluminum-germanium alloy and aluminum-magnesium alloy as materials for the bond wire, it should be noted that other aluminum alloys having superior mechanical strength and a relatively low melting point (preferably below 450° C.), such as aluminum-copper or other aluminum alloying constituents, could also be used and such are considered within the scope and contemplation of the present invention. The aluminum alloy bonds formed as a result of the method of the present invention exhibit better mechanical and electrical reliability when compared with the prior art lead-tin solder connections. One of the reasons for this is that the aluminum alloy bond is mechanically stronger than the lead-tin solder connection under repeated thermal cycling and is more resistant to thermal oxidation.

Figure 3A:
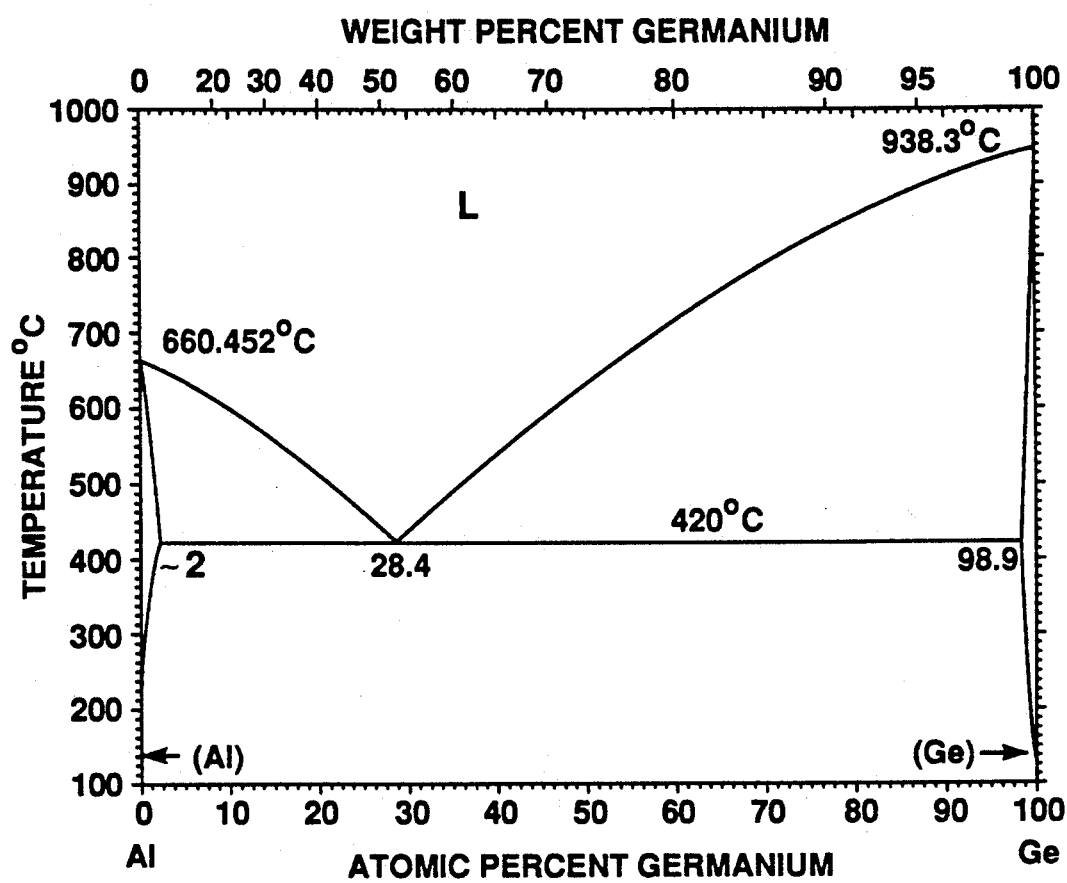
FIGS. 3A and 3B are binary alloy phase diagrams for a preferred alloy, aluminum-germanium, for bond wires in accordance with the present invention.
Figure 3B:
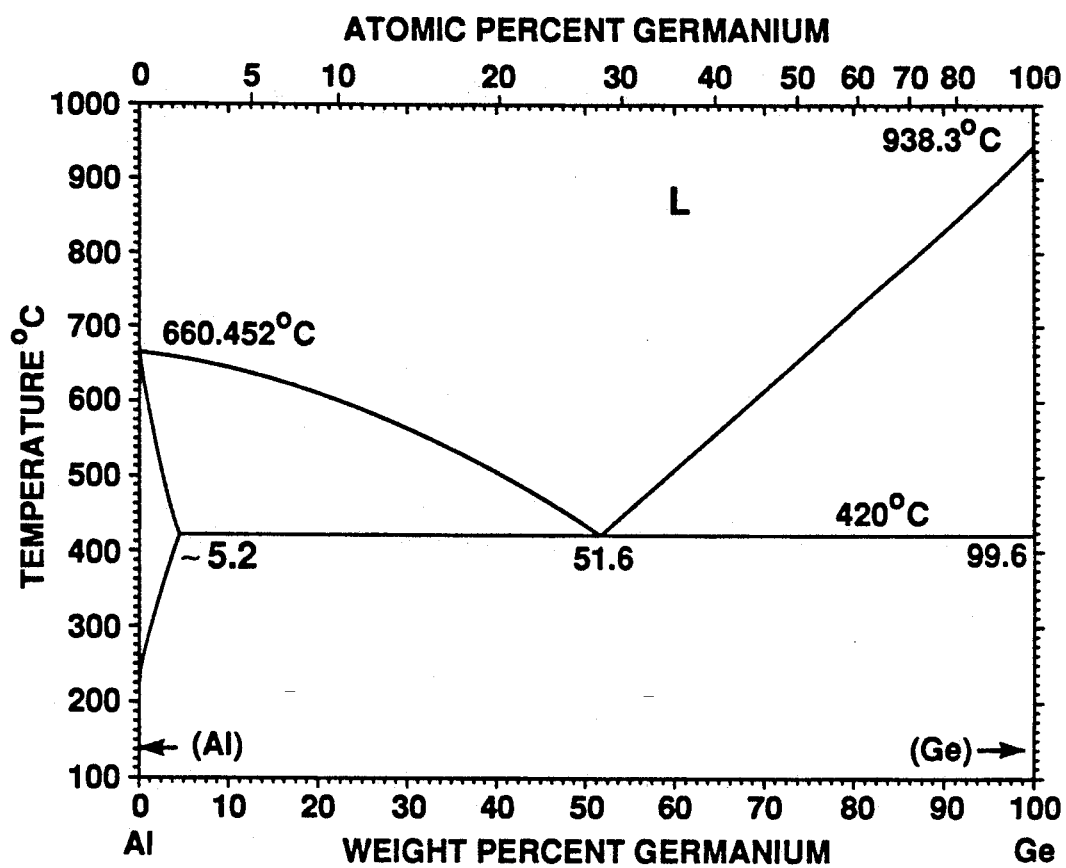

As stated above, it is desirable that the aluminum alloy have a relatively low melting point. As shown in FIGS. 3A and FIGS. 3B, the eutectic of aluminum-germanium alloy, one of the preferred alloys of the present invention, exhibits a melting point of 420° C. The material composition at the eutectic, 51.6 weight percent germanium, exhibits superior mechanical strength and electrical conductivity, as well as resistance to thermal cycling.

It will be understood that various changes in the details, materials and arrangement of the parts which have been described and illustrated in order to explain the nature of this invention, may be made by those skilled in the art without departing from the principles and scope of the invention as expressed in the following claims.

I claim:

1. A method for bonding a pad on a semiconductor chip to a corresponding pad on a carrier comprising the steps of:
   1) providing a bond wire comprising a low melting temperature aluminum alloy material;
   2) forming a wire ball attached to a pad on the chip by bonding one end of the bond wire to the pad on the chip;
   3) breaking the wire off at the bond;
   4) forming a bead on the chip pad by heating the ball to a temperature slightly above the melting point of the bond wire material for a predetermined period of time; and
   5) placing the melted bead into contact with a corresponding pad on the carrier.

2. The method in accordance with claim 1 wherein said low melting temperature aluminum alloy material comprises an aluminum-germanium alloy.

3. The method in accordance with claim 1 wherein said low melting temperature aluminum alloy material comprises an aluminum-magnesium alloy.

4. The method in accordance with claim 1 wherein said low melting temperature aluminum alloy material comprises an aluminum-copper alloy.

5. The method in accordance with claim 1 wherein steps 4 and 5 are carried out under reducing or inert conditions.

6. A method for bonding a pad on a semiconductor chip to a corresponding pad on a carrier comprising the steps of:
   1) forming a bead on the pad on the chip by dispensing a ball of molten bonding material comprising a low melting temperature aluminum alloy from a heated capillary tube onto the pad on the chip;
   2) heating the bead to a temperature slightly above the melting point of the bonding material for a predetermined period of time; and
   3) placing the melted bead into contact with a corresponding pad on the carrier.

7. The method in accordance with claim 6 wherein said low melting temperature aluminum alloy comprises an aluminum-germanium alloy.

8. The method in accordance with claim 6 wherein said low melting temperature aluminum alloy comprises an aluminum-magnesium alloy.

9. The method in accordance with claim 6 wherein said low melting temperature aluminum alloy comprises an aluminum-copper alloy.

10. The method in accordance with claim 6 wherein steps 2 and 3 are carried out under reducing or inert conditions.

11. A method for bonding a pad on a semiconductor chip to a corresponding pad on a carrier comprising the steps of:
   1) forming at least one aluminum bond pad on a semiconductor chip;
   2) forming a protective layer over the surface of the semiconductor chip and said at least one bond pad;
   3) forming a window in the protective layer for each aluminum pad exposing said aluminum;
   4) providing a bond wire comprising a low melting temperature aluminum alloy material;
   5) forming a wire bond ball attached to a pad on the chip by bonding one end of the bond wire to the pad on the chip;

6) breaking the bond wire off at the bond;
7) forming a bead on the chip pad by heating the ball to a temperature slightly above the melting point of the bond wire material for a predetermined period of time; and
8) placing the melted bead into contact with a corresponding pad on the carrier.

12. The method in accordance with claim 11 wherein said low melting temperature aluminum alloy material comprises an aluminum-magnesium alloy.

13. The method in accordance with claim 11 wherein said low melting temperature aluminum alloy material comprises an aluminum-germanium alloy.

14. The method in accordance with claim 11 wherein said low melting temperature aluminum alloy material comprises an aluminum-copper alloy.

15. The method in accordance with claim 11 wherein steps 7 and 8 are performed under reducing or inert conditions.

* * * * *